(12) United States Patent
Chen et al.

(10) Patent No.: US 6,538,486 B1
(45) Date of Patent: Mar. 25, 2003

(54) LATCH CHAIN HAVING IMPROVED SENSITIVITY

(75) Inventors: Young-Kai Chen, Union, NJ (US); Claus Dorschky, Nuremberg (DE); Carsten Groepper, Nuremberg (DE); George Georgiou, Morris, NJ (US); John Mattia, San Jose, CA (US); Rajasekhar Pullela, West Lake Village, CA (US); Mario Reinhold, Nuremberg (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/686,236

(22) Filed: Oct. 11, 2000

(51) Int. Cl.⁷ .................................. H03K 3/289

(52) U.S. Cl. ....................... 327/202; 327/203

(58) Field of Search ................. 327/200, 201, 327/202, 203, 208, 209, 210, 211, 212, 218, 91, 94, 95, 96

(56) References Cited

U.S. PATENT DOCUMENTS

| | | | | | |
|---|---|---|---|---|---|
| 5,844,437 A | * | 12/1998 | Asazawa et al. | ............ | 327/202 |
| 5,969,556 A | * | 10/1999 | Hayakawa | ................... | 327/202 |
| 6,218,878 B1 | * | 4/2001 | Ueno | .......................... | 327/202 |

* cited by examiner

*Primary Examiner*—Tuan T. Lam
(74) *Attorney, Agent, or Firm*—Darby & Darby

(57) ABSTRACT

A latch chain having improved input voltage sensitivity. The chain includes a first latch, an amplifier, and a second latch connected in series. The second latch is a conventional latch. The first latch is modified to have a higher sensitivity and lower output voltage swing than conventional latches. The modified latch includes a pair of matched output transistors that generate output voltages and a pair of matched biasing circuits to bias the bases of the output transistors with bias voltages. A sample stage is connected so as to apply first biasing currents to one of the biasing circuits in response to input voltages applied to the first latch during the sample period. In addition, a hold stage is connected so as to apply second biasing currents to the biasing circuits during a hold period. The sample and hold stages are configured to apply different voltage differences between the bases of the output transistors.

6 Claims, 5 Drawing Sheets

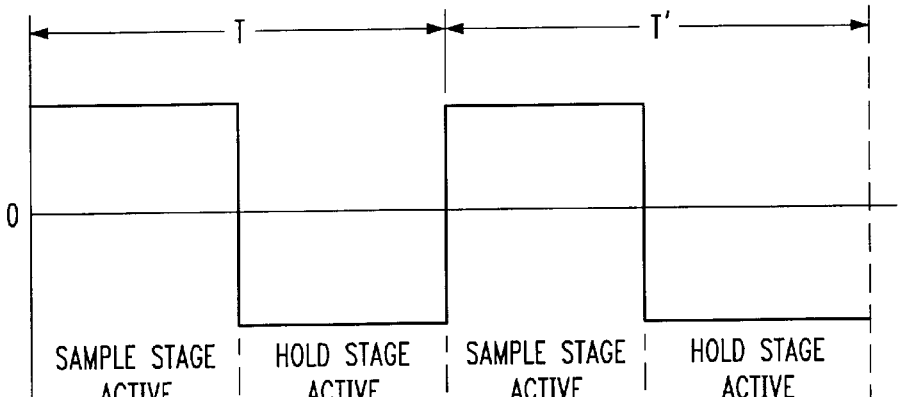
FIG. 6A
CLOCK PERIOD
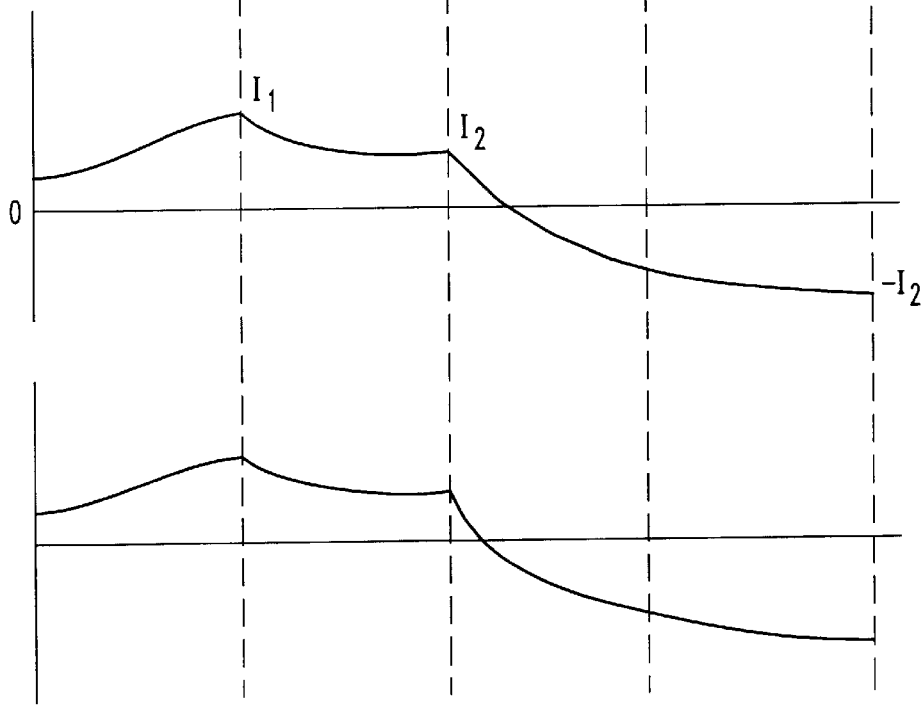
FIG. 6B
DIFFERENTIAL CURRENT IN RESISTORS 36,38
FIG. 6C
DIFFERENTIAL VOLTAGE $V_{AB}$

US 6,538,486 B1

LATCH CHAIN HAVING IMPROVED SENSITIVITY

FIELD OF INVENTION

The present invention relates to digital latches and latch chains having improved sensitivity.

DESCRIPTION OF RELATED ART

FIG. 1 shows a conventional digital latch 1 that includes a sample stage 2 with complementary voltage inputs 3, 4, a hold stage 5, and matched transistors 6, 7 having complementary voltage outputs 8, 9. The transistors 6,7 are biased by complementary currents through matched resistors R.

During a sample period, sample stage 2 generates a current through resistors R to produce a voltage difference Vab between nodes A and B responsive to the voltage difference Vin–$\overline{\text{Vin}}$ between input terminals 3 and 4. The values of the voltage difference Vab correspond logical values +1 and 0. During a subsequent hold period, hold stage 5 maintains the current through resistors R so that the voltage difference Vab remains unchanged. The voltages at nodes A and B cause output voltages Vout and $\overline{\text{Vout}}$ at output terminals 8 and 9, respectively. The difference between output voltages Vout and $\overline{\text{Vout}}$ is indicative of the logic value stored during the previous sample period. During the hold period, external digital devices may sample the voltages at terminals 8, 9 to determine the logic value stored in the latch 1.

The sensitivity of a latch to input voltages sets performance limitations on several mixed-signal integrated circuit (IC) applications of the latch. These applications include digital phase detection in clock-data recovery circuits and fiber receivers. Improved circuit performance in such applications may be realized by improving the sensitivity of the latch.

It is therefore desirable to develop a digital latch and latch chain with improved sensitivity to input voltages.

SUMMARY OF INVENTION

One aspect of the present invention is directed to a latch chain having improved input voltage sensitivity. The chain includes a first latch, an amplifier, and a second latch connected in series. The second latch is a conventional latch. The first latch is modified to have a higher sensitivity and lower output voltage swing than conventional latches. The modified latch includes a pair of matched output transistors that generate output voltages and a pair of matched biasing circuits to bias the bases of the output transistors with bias voltages. A sample stage is connected so as to apply first biasing currents to one of the biasing circuits in response to input voltages applied to the first latch during the sample period. In addition, a hold stage is connected so as to apply second biasing currents to the biasing circuits during a hold period. The sample and hold stages are configured to apply different voltage differences between the bases of the output transistors.

BRIEF DESCRIPTION OF THE DRAWING

The foregoing and other features of the invention will be more apparent from the following detailed description and drawings of illustrative embodiments wherein like reference numbers refer to similar elements throughout the several views and in which:

FIGS. 6a–6c are timing diagrams for the modified latch in FIG. 4.

DETAILED DESCRIPTION OF THE PREFERRED EMBODIMENTS OF THE INVENTION

Figure 2:
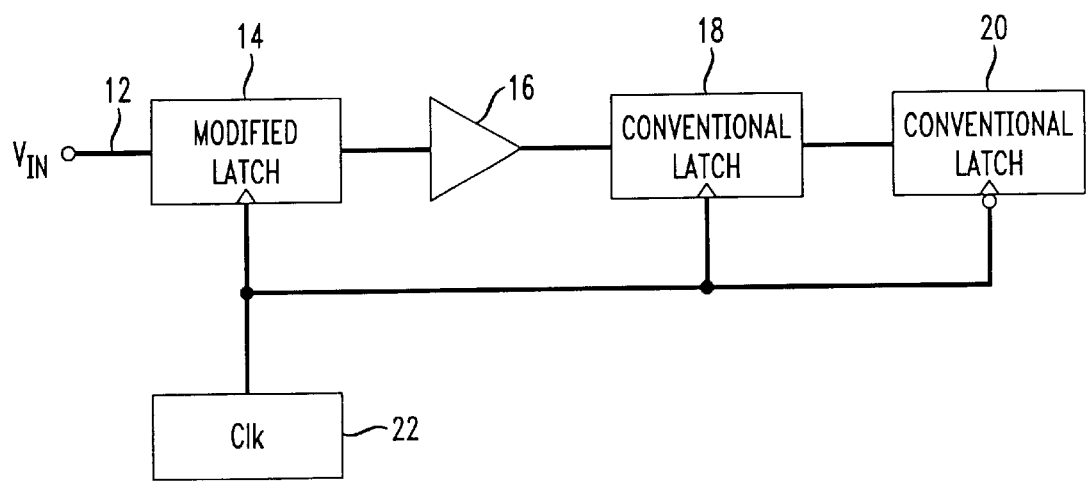
FIG. 2 is an exemplary latch chain with improved sensitivity to input voltages in accordance with the present invention.

FIG. 2 is an exemplary latch chain 10 with improved sensitivity to input voltages Vin. Latch chain 10 includes a modified latch 14, an amplifier 16, and conventional latches 18, 20, which are serially connected to the output of the amplifier 16. Two conventional latches 18, 20 are shown in FIG. 2, however, any number of one or more conventional latches may be serially connected in the chain, as desired. Each latch 14, 18, 20 has a sample period and a hold period triggered by signals from an external clock 22. The amplifier 16 is not controlled by the clock 22.

Modified latch 14 has an input terminal 12 that also serves as the input terminal for the latch chain 10. At its input terminal 12, the modified latch 14 has a higher input voltage sensitivity than conventional latches 18, 20 of the chain 10. As a result of the higher input voltage sensitivity of modified latch 14, the entire latch chain 10 is more sensitive to input voltage Vin swings.

Figure 1:
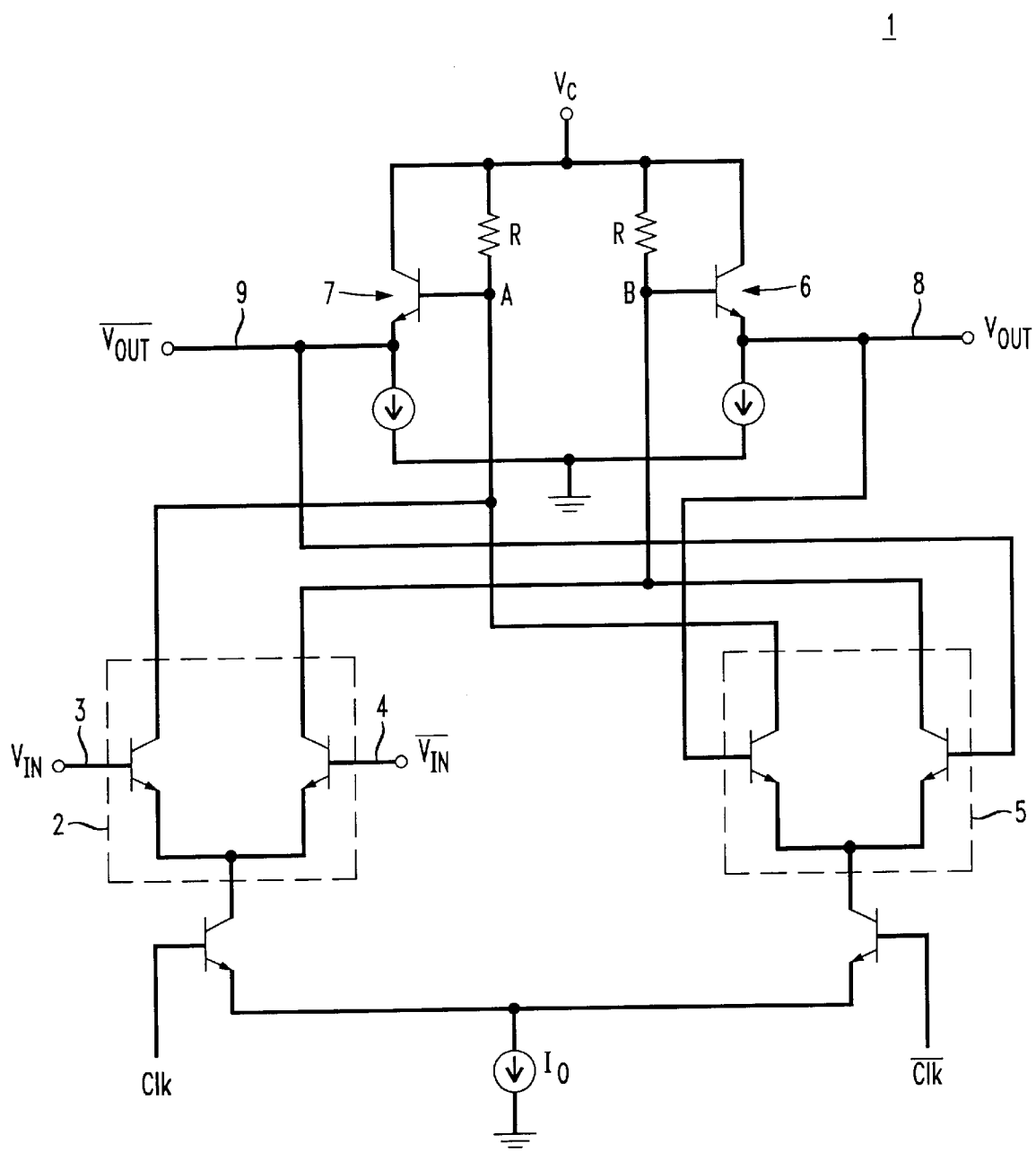
FIG. 1 shows a conventional digital latch.

Referring again to FIG. 1, prior to storing a new logic value Vab, conventional latch 1 must discharge the previously stored voltage Vab between nodes A and B. The time needed to discharge the previously stored voltage difference Vab is dependent on the internal parasitic capacitances of the latch 1. If the time for discharge is greater than one sample period, the latch 1 is unable to store the new logic voltage Vab during the next sample period. Thus, proper operation of the latch 1 requires that the sample period be longer than the time needed to discharge the previous voltage Vab between nodes A and B. Thus, sampling rates are limited by internal parasitic capacitances of the latch 1.

The length of the sample period limits the input sensitivity of latch 1, because the rate of discharge of a previously stored voltage Vab depends on the absolute value of Vin–$\overline{\text{Vin}}$. If the input voltages are too low in amplitude, the latch 1 will not completely discharge the previously stored voltage Vab thereby prohibiting setup of a new voltage difference Vab associated with a new logic value during the next sample period.

Referring again to FIG. 2, modified latch 14 has a higher input voltage sensitivity than conventional latches 18, 20, because it performs smaller internal voltage swings than those latches 18, 20. The smaller voltage swings change the internal logic state. Thus, the modified latch 14 has to discharge less internally stored charge than conventional latches 18, 20, during the next sample period to change its logic state. The modified latch 14 is able to switch its stored logic state in response to a smaller absolute value of the input voltage Vin–$\overline{\text{Vin}}$ than conventional latches 18, 20. The higher sensitivity of the modified latch 14 produces a latch chain 10 having a higher sensitivity at a given clock rate than a conventional latch chain comprising sequentially coupled latches with identical sensitivities.

Figure 4:
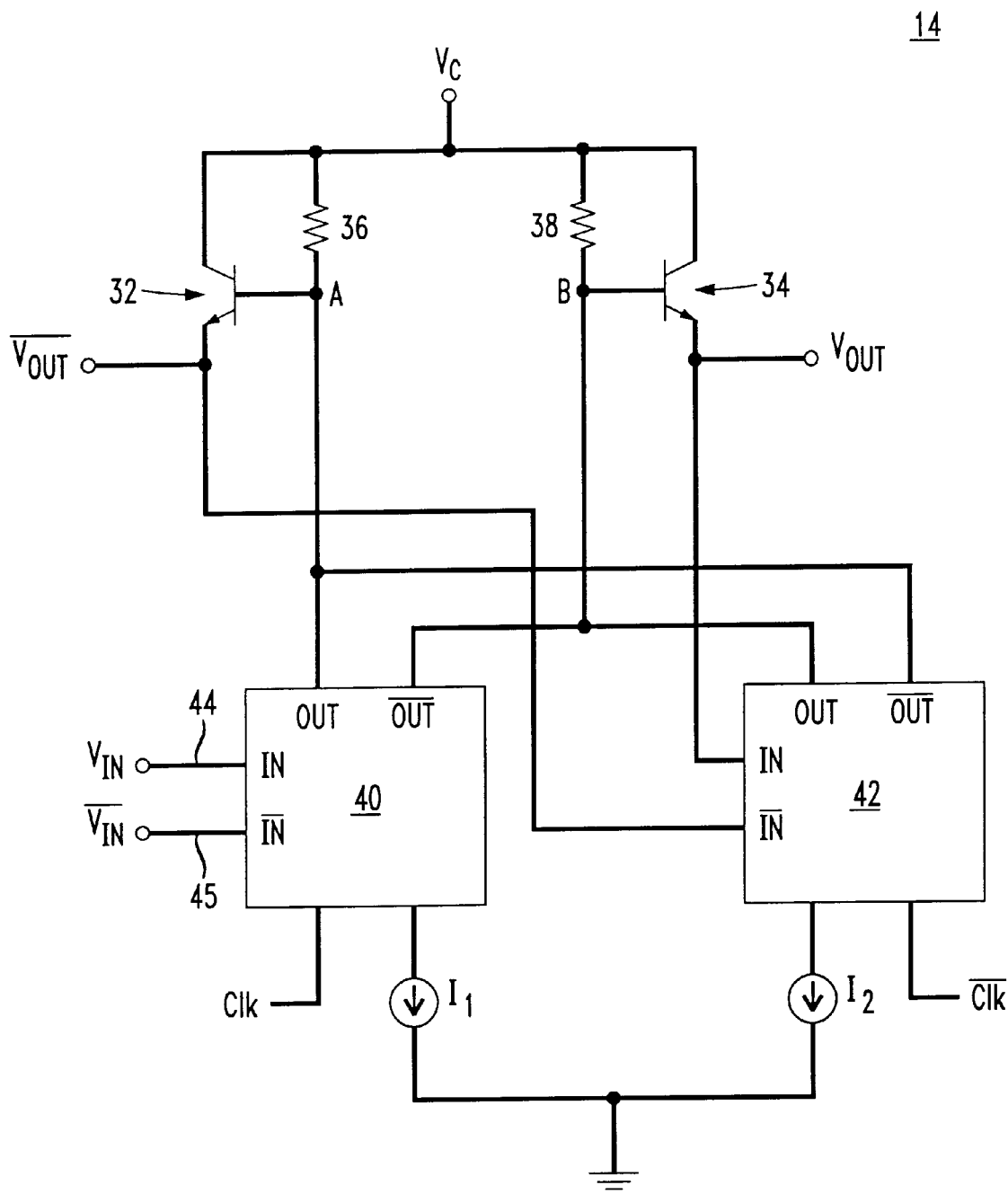
FIG. 4 is an embodiment of the modified latch of FIG. 2, which has improved sensitivity to input voltages.

The modified latch 14 in FIG. 2 generates smaller output voltage swings, i.e., a smaller swings of the amplitude of output voltage difference (Vout-$\overline{\text{Vout}}$), as a result of its smaller internal voltage swings, e.g., voltage swings between nodes A and B in the embodiment of FIG. 4. In some embodiments, the smaller output voltage swing of the modified latch 14 is below the input voltage sensitivity of next latch 18. Thus, coupling latch 18 to latch 14 directly could cause latch 18 to function improperly. Amplifier 16 boosts the output voltage swing from the modified latch 14 to exceed the minimum switching threshold for latch 18.

The switching threshold for latch 18 is dependent on the frequency of external clock 22. Thus, in a conventional cascaded latch chain in which each latch is controlled by an external clock, the overall sensitivity of the latch chain is dependent on the clock frequency. Amplifier 16 in FIG. 2, however, is not controlled by external clock 22 and therefore, can have a higher gain bandwidth product than modified latch 14. Since amplifier 16 is unclocked, the transmission delay introduced by the device is intrinsic and associated with setup and transmission times of the amplifier's internal components. Nevertheless, the intrinsic transmission delays produced by the amplifier 16 should substantially match those delays caused by conventional latches, e.g., latches 18, 20, that are controlled by the external clock 22. Amplifier 16 provides the gain necessary to produce an output voltage that properly operates the next latch 18 in response to lower input voltages than needed by clock-controlled latches 18, 20 for proper operation.

For proper timing, amplifier 16 receives an output voltage during a hold period of modified latch 14 and transmits an amplified voltage to the next latch 18 during that latch's sample period. Thus, amplifier 16 exhibits approximately a one half clock cycle delay between receipt of the output voltage from the modified latch 14 and transmission of the amplified output voltage to the next latch 18 so as to ensure that the new voltage arrives at the next latch 18 during that latch's sample period.

Figure 3:
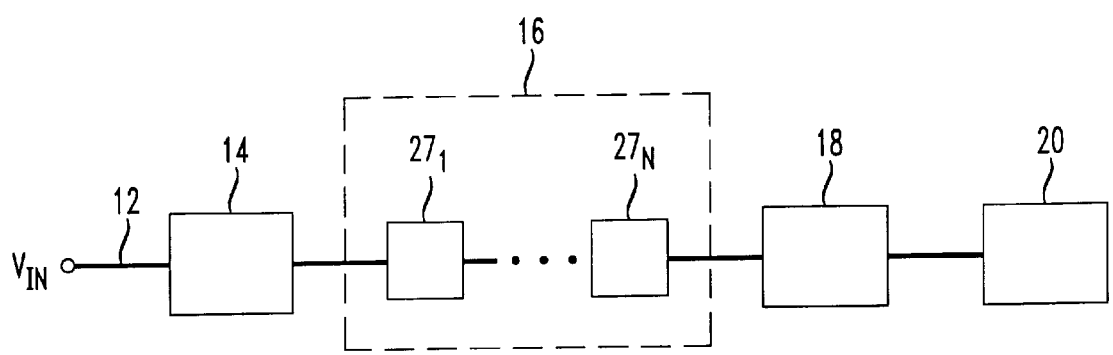
FIG. 3 is an embodiment of the amplifier in the latch chain of FIG. 2.

FIG. 3 is an alternative embodiment of the latch chain of FIG. 2, wherein amplifier 16 comprises a cascaded sequence of N amplifier stages $27_1, \ldots, 27_N$, wherein $N \geq 1$. Each amplifier stage $27_1, \ldots, 27_N$ may be a Cherry-Hooper amplifier stage or any other differential amplifier which produces a characteristic delay between receipt of an input voltage and transmission of an amplified output voltage signal. The sequence of "N" cascaded amplifier stages is selected to produce a total delay of approximately one half of the clock cycle of external clock 22.

FIG. 4 is an exemplary modified latch 14 in FIG. 2. Modified latch 14 includes matched output transistors 32, 34. The base of output transistors 32, 34 are biased by voltages across matched resistors 36, 38. Resistors 36, 38 are connected to a voltage source Vc and receive complementary current pairs from either sample stage 40 or hold stage 42 so that output transistors 32, 34 produce complementary or opposite output voltages Vout and $\overline{\text{Vout}}$. Sample and hold stages 40, 42 are similar in construction, each including paired inputs 44, 45 and paired outputs 46, 47. In response to complementary voltages being applied at inputs 44, 45, sample and hold stages 40, 42 generate complementary current values on the paired outputs 46, 47 of the same stage 40, 42, respectively.

In response to receiving input voltages Vin and $\overline{\text{Vin}}$, sample stage 40 generates a voltage differential Vab between nodes A and B that corresponds to the logic value associated with Vin-$\overline{\text{Vin}}$. Hold stage 42 maintains a previously established voltage differential Vab at a value indicative of the stored logic value during the hold period. During the hold period, the output voltages Vout and $\overline{\text{Vout}}$ may be sampled by other digital devices to determine the logic value stored in latch 14.

Figure 5:
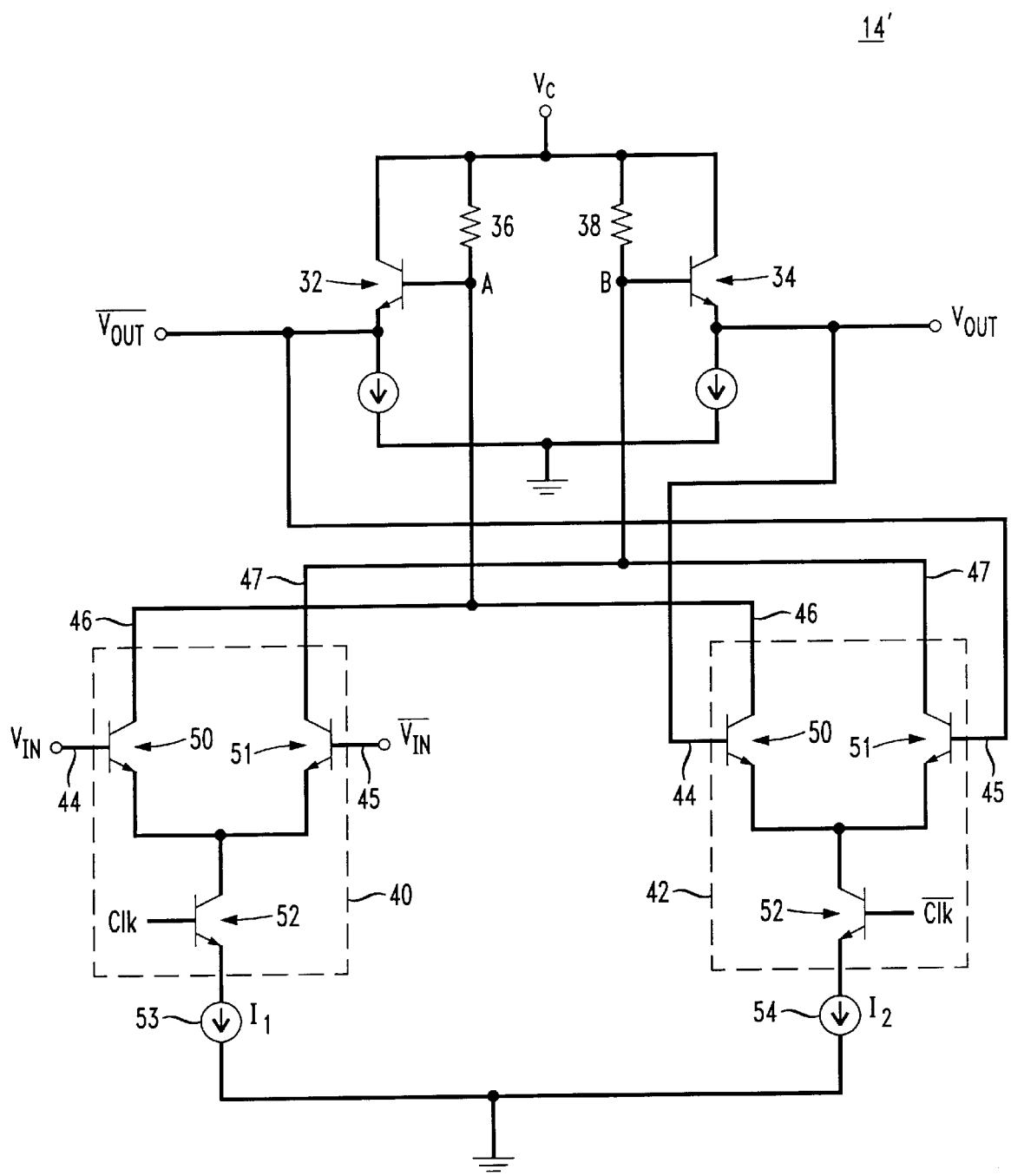
FIG. 5 is one embodiment of the modified latch in FIG. 4.

FIG. 5 is an embodiment of the modified latch in FIG. 4. Sample stage 40 comprises a pair of transistors 50, 51 whose emitters are connected to the collector of a third transistor 52. Hold stage 42 is similar in construction to that of sample stage 40 but, input voltages for the sample stage 40 are $\overline{\text{Vout}}$ and Vout, instead of Vin and $\overline{\text{Vin}}$. Also, the transistors 52 of the sample stage 40 and the hold stage 42 turn on in response to high and low clock voltages, respectively.

Sample and hold stages 40, 42, are connected to external current sources 53, 54 that produce different current values. Because each stage 40, 42 has a different current source 53, 54, different currents are applied to resistors 36, 38, and thus, output transistors 32, 34 produce different output voltages Vout at the end of sample and hold periods, respectively. The different currents in resistors 32, 34 during the sample and hold periods imply that the absolute amplitude of the voltage difference Vab between nodes A and B changes between sample and hold periods unlike in conventional latch 1 of FIG. 1.

FIGS. 6a–6c are timing diagrams that illustrate the operation of the sample and hold stages 40, 42 of the modified latch 14 during a clock period T and subsequent or next clock period T'. Depending on the value of the clock signal, either the sample stage 40 or the hold stage 42 is activated and applies a current to one of nodes A and B. Specifically, when the clock signal is high, the sample stage 40 of the modified latch 14 is active and applies a current to one of nodes A and B and the hold stage 42 is disconnected. When the clock signal is low, the hold stage 42 becomes active and applies a current to one of nodes A and B and the sample stage 40 is disconnected.

An exemplary timing diagram of the differential current in resistors 36, 38 is represented by the curve shown in FIG. 6b. During the sample period (when the clock signal is high), the differential current in the resistors 36, 38 increases until a final value of $I_1$, at the end of the sample period, wherein $I_1$ is proportional to the input voltage to the latch 14. Thereafter, the clock signal transitions low and the modified latch 14 switches to the hold period during which the differential current in resistors 36, 38 changes from $I_1$, at the beginning of the hold period, to $I_2$, at the end of the hold period. If input voltages applied to the latch 14 did not change between the sampling portion of clock period T and the sampling portion of the previous clock period, then $I_1 > I_2$ as shown in FIG. 6b.

The curve representative of the voltage differential Vab between nodes A and B, as shown in FIG. 6c, mirrors that of the current differential curve shown in FIG. 6b merely being scaled by the resistance of matched resistor 36 or 38. The current $I_2$, at the end of the hold portion of clock period T, is smaller than the current $I_1$, at the end of the sample portion of the same clock period. Thus, the differential voltage Vab between nodes A and B is also smaller at the end of the hold portion of clock period T than at the end of the sample portion of the same clock period. Thus, less time is required to dissipate the stored charge Vab when transitioning to a new logic state during the next clock cycle T' than in a conventional latch 1 of FIG. 1 where the same current is applied to nodes A and B during sample and hold periods.

Accordingly, current sources 53, 54 are set so that $|I_1|>|I_2|$ to reduce the input voltage needed to switch latch 14 thereby improving the overall sensitivity of the latch chain 10 of FIG. 2. At the end of the hold period, the stored voltage difference Vab is however associated with 12, which has a smaller absolute value than $I_1$. If a new logic value is to be loaded in latch 14 at the next clock edge, the previously stored voltage Vab must discharge during the sample period of that next clock period. Since $|I_2|<|I_1|$, the amount of charge that must be discharged to discharge Vab is reduced. This discharge, which is controlled by internal capacitances and the value of the input voltage, can be completed in response to a lower input voltage giving the latch 14 a higher sensitivity. At the end of the hold period for next clock cycle T', the differential current in the resistors 36, 38 is $-I_2$, and the stored voltage difference Vab has the opposite sign with respect to its value at the end of the hold period of the clock cycle T.

Thus, while there have been shown, described, and pointed out fundamental novel features of the present invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

What is claimed is:

1. A cascaded latch chain, comprising:
    a first latch having an input and an output, comprising:
        an output transistor to produce output voltages on the output of the first latch;
        a biasing circuit to bias a base of the output transistor with a bias voltage;
        a sample stage connected to apply first biasing currents to the biasing circuit in response to an input voltage applied to the first latch during the sample period; and
        a hold stage connected to apply second biasing currents to the biasing circuit in response to an input voltage applied to the first latch during the sample period, the sample and hold stages configured to bias the base to different potentials;
    an amplifier having an input and an output, the input of the amplifier being connected to receive a signal from the output of the first latch; and
    a second latch having an input connected to the output of the amplifier, the first latch having a higher sensitivity and lower output voltage swing than the second latch.

2. The cascaded latch chain of claim 1, wherein the absolute value of the second biasing current is less than the absolute value of the first biasing current.

3. A cascaded latch chain, comprising:
    a first latch having an input and an output;
    an un-clocked amplifier having an input and an output, the input of the amplifier being connected to receive a signal from the output of the first latch; and
    a second latch having an input connected to the output of the amplifier, the first latch having a higher sensitivity and lower output voltage swing than the second latch.

4. The cascaded latch chain of claim 3, further comprising:
    a clock having a predetermined cycle, the clock being coupled to switch each of the first and second latches between sample and hold periods.

5. The cascaded latch chain in accordance with claim 4, wherein the amplifier generates an amplified output signal having a delay between receipt of an output signal from the first latch and transmission of the amplified output signal of approximately one half of the cycle of the clock.

6. The cascaded latch chain of claim 3, wherein the first latch produces an output voltage below an input sensitivity of the second latch.

* * * * *